United States Patent
Wang

Patent Number: 5,929,795
Date of Patent: Jul. 27, 1999

[54] DIGITAL PROCESSOR FOR REDUCED DISTORTION AND FREQUENCY DEVIATION

[75] Inventor: Mingjie Wang, Eatontown, N.J.

[73] Assignee: Lucent Technologies Inc., Murray Hill, N.J.

[21] Appl. No.: 08/878,925

[22] Filed: Jun. 19, 1997

[51] Int. Cl.⁶ .................. H03M 1/62; G01H 1/02
[52] U.S. Cl. .............. 341/118; 455/232.1; 375/285
[58] Field of Search ..................... 341/110, 118, 341/143, 155, 138, 140, 144; 455/232.1; 375/285

[56] References Cited

U.S. PATENT DOCUMENTS

| | | | |
|---|---|---|---|
| 4,562,438 | 12/1985 | Rouse et al. | 343/17.1 R |
| 4,877,981 | 10/1989 | Gomes | 307/555 |
| 4,907,087 | 3/1990 | Schreiber | 358/186 |
| 5,127,054 | 6/1992 | Hong et al. | 381/36 |
| 5,253,043 | 10/1993 | Gibson | 358/21 |
| 5,671,256 | 9/1997 | Clark et al. | 375/342 |
| 5,789,689 | 8/1998 | Doidic et al. | 84/603 |

*Primary Examiner*—Howard L. Williams
*Assistant Examiner*—Peguy Jean Pierre

[57] ABSTRACT

Apparatus, system, and method is disclosed for digitally processing a signal for reduced distortion and frequency deviation. The digital processor involves increasing the sampling frequency of a digital signal prior to a non-linear operating stage. The processed signal is then passed through a low pass filter prior to being down-converted to the initial sampling frequency. Thus, a signal can be digitally processed for reduced distortion as well as reduced frequency deviation.

26 Claims, 3 Drawing Sheets

DIGITAL PROCESSOR FOR REDUCED DISTORTION AND FREQUENCY DEVIATION

FIELD OF THE INVENTION

This invention relates to the field of signal processing techniques and in particular, digital processing techniques for reduced distortion and frequency deviation.

BACKGROUND OF THE INVENTION

In communication systems, it is advantageous to transmit and receive signals with little or no distortion so that all of the information in the signal can be preserved and processed. It is not desirable to introduce spurious signals that can mask or distort the original signal. Additionally, large signal peaks or spikes that can create excessive frequency deviation when the signal is modulated or that can saturate a system and produce harmonic distortion are not beneficial. Thus, the ability to perform non-linear operations, such as limiting the magnitude of the signal, is desirable, providing the non-linear operation does not introduce spurious signals.

The prior art, as shown in FIG. 1 in conjunction with FIG. 2, illustrates some inherent problems when processing signals. In FIG. 1, the signal 100 contains all of its information in the carrier frequency 102. In FIG. 2, the nonlinear operation of limiting is performed on the signal 100, introducing undesirable harmonics 206, 208, and 210 along with higher order harmonics. In the analog domain, the harmonics 206, 208, and 210 are removed with a low pass filter 212, which passes the primary frequency band, including the carrier frequency 102, but filters out the higher order harmonics. However, analog implementations are generally larger, more costly, and consume more power than their digital counterparts.

In portable communication systems, size, cost, power, flexibility, and repeatability are paramount concerns; consequently, digital implementations are desirable.

In the digital domain, all harmonics whose frequency is greater than half the sampling rate alias, or "fold over", into the primary frequency band, leading to severe distortion. If the initial signal is band limited to [−W, W], then digital processing can be performed at a rate, 2W. If a digital signal has an initial frequency, f, then the non-linear operation of limiting the signal produces harmonics at frequencies mf, m being an odd integer. Certain harmonics, as determined in equation 1, fold-over or produce an alias of that harmonic in the primary frequency band [−W, W].

(1) Alias =|mf+2kW|<W m=odd integer f=initial frequency k=any positive or negative integer W=primary frequency band [−W, W]

2W=sampling frequency or rate

In FIG. 3, the prior art illustrates the effects of non-linear operations on an input signal 310 with a frequency of 3 kHz. With a bandwidth of ±4 kHz and a sampling rate of 8 kHz, the third harmonic 312 folds over into the primary frequency band at 1 kHz; consequently, the third harmonic cannot be removed with a low pass filter. Because the third harmonic is only 15 dB down, it leads to significant and undesirable distortion.

Accordingly, there is a need to provide a low cost, small size, and low power digital processor for reduced distortion and frequency deviation.

SUMMARY OF THE INVENTION

The present invention teaches a device which can digitally process a signal for reduced distortion and frequency deviation. The disclosed technique increases the effective sampling rate of the digital signal prior to the application of a non-linear operation. This results in lower amplitude aliased harmonics in the band of interest. Importantly, by performing the operation in the digital domain, there are significant reductions in size, cost, and power requirements.

In an exemplary embodiment of the present invention, an up-sampling means increases the initial sampling frequency of a digital input signal by a given ratio to form an up-sampled digital signal. A non-linear operation is performed on the up-sampled digital signal and the resulting signal is fed to a low pass filter. A converter then downsamples and restores the output of the low pass filter to the initial sampling frequency. By increasing the initial sampling rate, the effects of aliasing or fold-over due to the non-linear operation are reduced. Thus, an analog voice signal can be digitally processed without degradation in the final transmitted signal.

Advantageously, the present invention can be used with any application in which distortion due to aliasing effects must be reduced. By solving the problem digitally, the present invention can be incorporated into the digital chip design. As such, it is useful in portable communication systems where size, cost, power, flexibility, and repeatability are primary concerns. The present invention is a versatile and simple solution to a digital processing problem.

BRIEF DESCRIPTION OF THE DRAWINGS

A more complete understanding of the present invention may be obtained from consideration of the following description in conjunction with the drawings in which.

DETAILED DESCRIPTION

In accordance with the present invention, an exemplary digital processor for reduced distortion and frequency deviation is responsive to increases in the sampling frequency of a digital signal. In the present invention, a digital signal has its initial sampling rate increased. The up-sampled signal is processed by a non-linear operator. The processed signal is then fed to a low-pass filter. The combination of the up-sampling and the low-pass filtering reduces the harmonic distortion of the digital signal. It is because of this reduction in distortion that non-linear operations can be implemented in the digital domain for, among other purposes, reduced frequency deviation.

Figure 4:
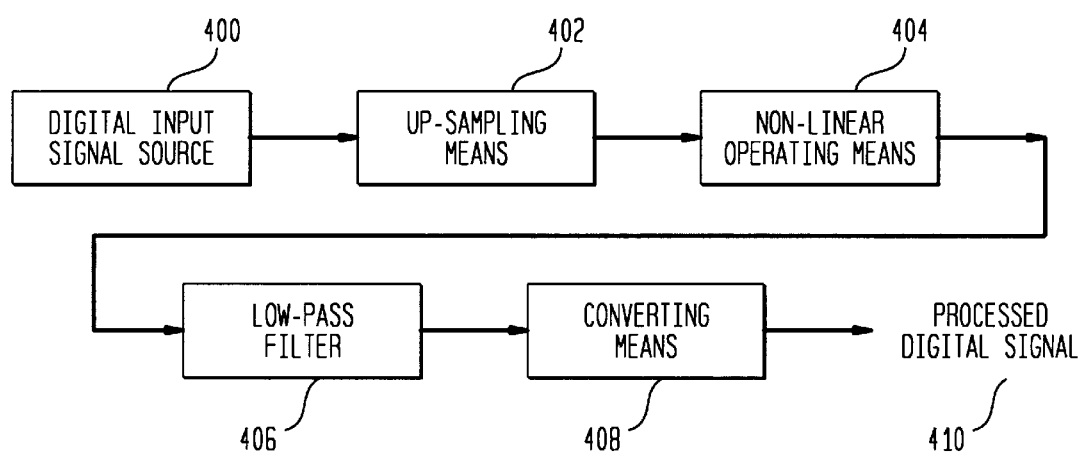
FIG. 4 is a block diagram of an exemplary digital processor for reduced distortion and frequency deviation.

An exemplary digital processor can be seen in FIG. 4. A digital input signal source 400 generates a digital input signal to be received by the up-sampling means 402. The digital input signal has an initial sampling frequency. The up-sampling means inserts additional data samples to effectively increase the initial sampling frequency of the digital input signal. The additional data samples are normally generated by interpolating between existing data samples in the digital input signal. Thus, inserting one additional sample between existing samples doubles the sampling rate while adding three samples quadruples the sampling rate.

In FIG. 4 of the present invention, the up-sampling means 402 passes the signal to a non-linear operating means 404. A problem with non-linear operators is the introduction of harmonic distortion in the digital signal. Certain harmonics, as shown in equation 1, fold-over or produce an alias of that harmonic in the primary frequency band.

A low-pass filter 406, coupled to the output of the non-linear operator 404 can be seen in the block diagram of the exemplary digital processor in FIG. 4. Low-pass 406 is, for example, a digital low-pass filter. The low-pass filter is designed to pass the frequency of the digital input signal while rejecting the higher frequency harmonics. In audio applications where the information in the input signal has a frequency below or near 3 kHz, the low-pass filter can be tuned to pass frequencies ranging from 0–3.2 kHz up to 0–4 kHz. Of course, if the signal contains information at higher frequencies, then the low-pass filter would be tuned accordingly to pass that information.

The converting means 408 decreases the sampling frequency of the digital signal. The resulting sampling frequency at the output of the converting means is equal to the initial sampling frequency, where the decrease in the sampling frequency is equal to the increase found in the up-sampling means. The decrease in sampling rate is accomplished by dropping samples in the digital signal. If every other sample in the signal is dropped, then the sampling rate is decreased by two. The ratio by which the sampling frequency is decreased or increased can be an integer or fractional number.

In the exemplary digital processor, the up-sampling means 402 is utilized to increase the sampling frequency and thereby decrease the number as well as the amplitude of the harmonics which can fold-over into the primary frequency band. Equation 2 shows equation 1 modified to reflect the increased sampling frequency.

Figure 1:
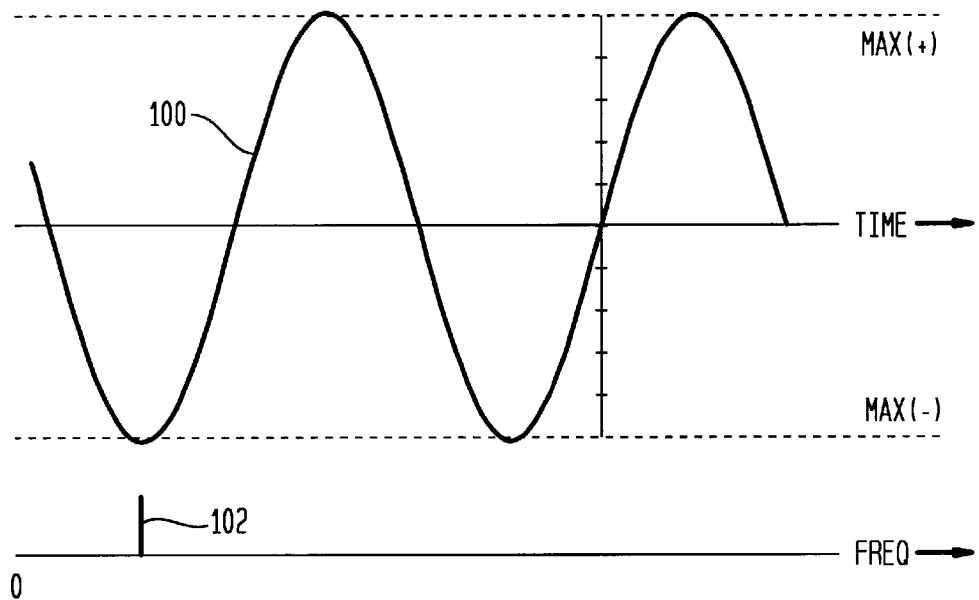
FIG. 1 is a time-frequency diagram in the prior art which illustrates a signal prior to processing.
Figure 2:
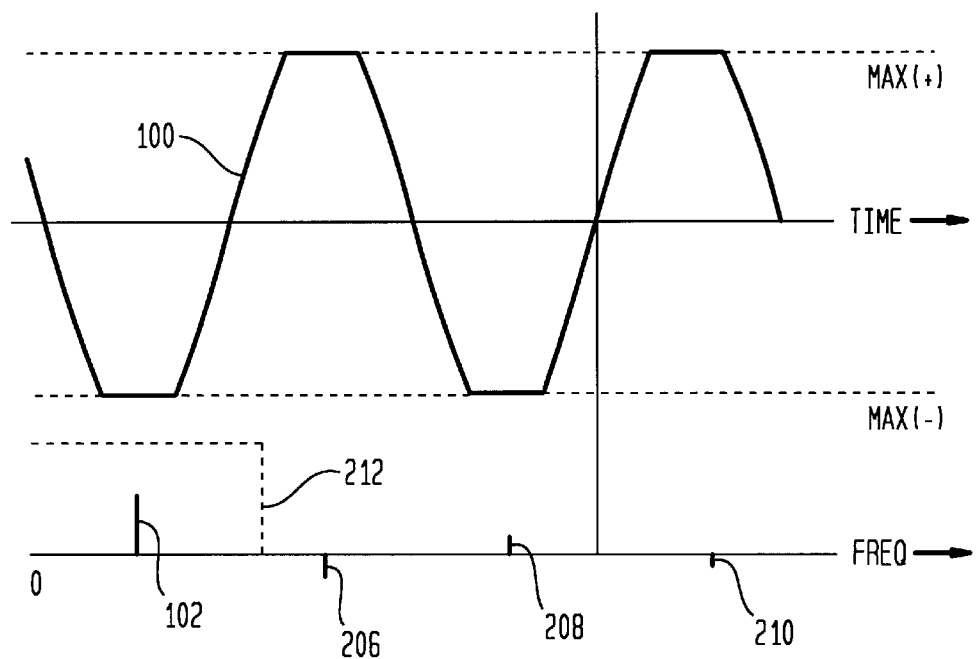
FIG. 2 is a time-frequency diagram in the prior art which illustrates the effects of a non-linear operation on an input signal.
Figure 3:
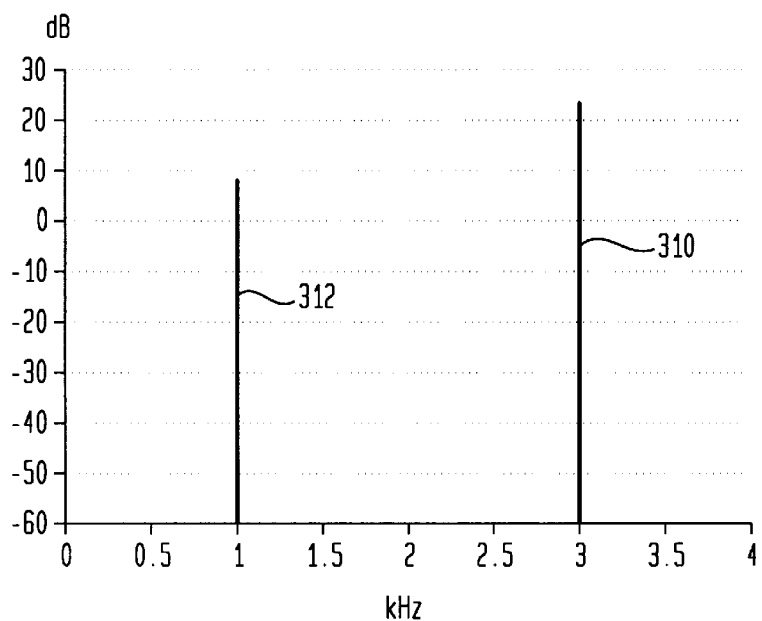
FIG. 3 is a frequency spectrum plot in the prior art which illustrates the effects of a non-linear operation on a digital input signal.

(2) Alias=$|mf+2kjW|<W$ m=odd integer f=initial frequency k=any positive or negative integer W=primary frequency band $[-W, W]$ j=ratio by which the sampling frequency was increased 2jW=up-sampled sampling frequency In FIG. 3, the undesirable harmonic is eliminated with the increased sampling frequency. If the sampling frequency is doubled, j=2, then the third harmonic, which aliased at 1 kHz without up-sampling, does not alias in the primary frequency band and is removed by the low-pass filter. Additional increases in the sampling ratio further reduce the number of lower order harmonics which alias and create harmonic distortion. In an embodiment of the present invention, the ratio in the up-sampling means is a multiple equal to two or more.

In one embodiment of the invention, the non-linear operating means 404 is a soft limiter. The soft limiting operation is represented by equations 3, 4, and 5.

(3) $y(t)=x(t)$, if $|x(t)|<T$ (4) $y(t)=T$, if $x(t)>T$ (5) $y(t)=-T$, if $x(t)<-T$ x(t)=signal prior to soft limiting y(t)=limited signal T=magnitude of limited signal Alternatively, the non-linear operating means can be the dynamic range of the system. A signal exceeding the dynamic range of the system is effectively limited. The output no longer responds to increases in the amplitude of the input signal. Thus, if the signal's amplitude exceeds the dynamic range of the system, the amplitude is limited to the extent of the dynamic range. An output signal which is limited includes harmonics in the higher frequencies, some of which fold over into the primary frequency band.

Figure 5:
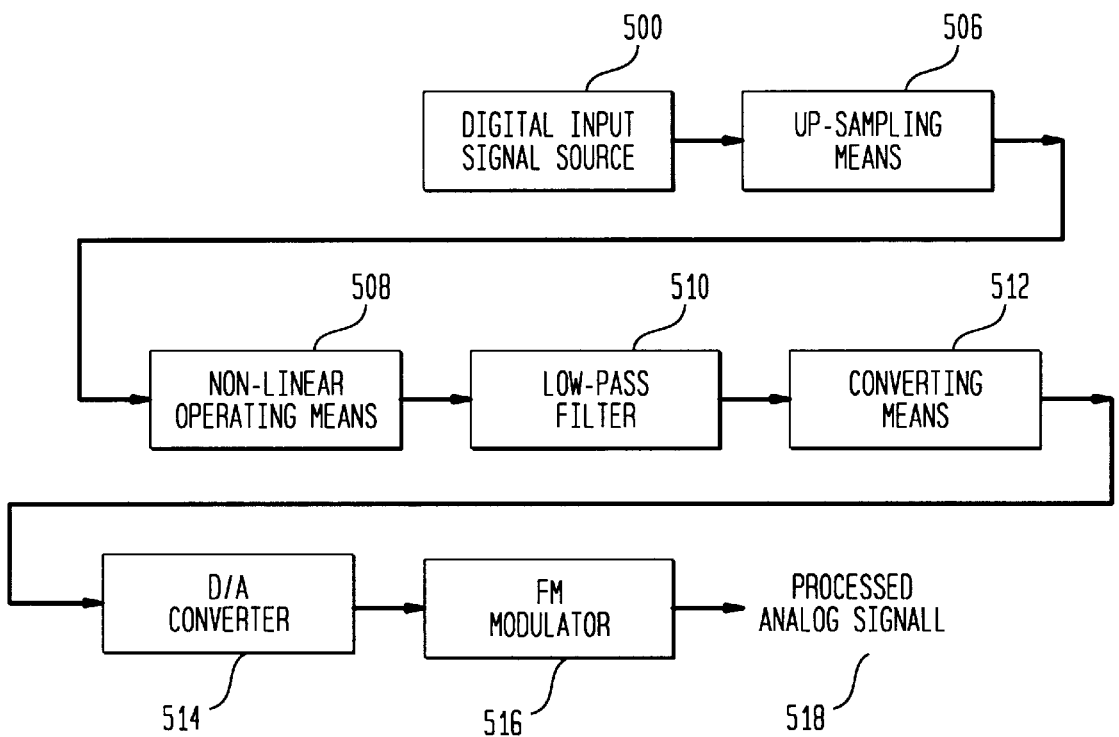
FIG. 5 is a block diagram of an exemplary digital processor for reduced distortion and frequency deviation which provides analog transmission.

In FIG. 5, a D/A converter 514 and an FM modulator 516 are depicted. In this embodiment of the invention, an output of the converting means 512 is received by a digital-to-analog converter 514 which converts the processed digital signal to an analog signal. The analog signal is received by an FM modulator 516 for transmission as an FM signal. Large amplitudes in the signal cause excessive frequency deviation during FM modulation. By including a non-linear operating means 508 to process the digital signal, the present invention can digitally limit the amplitude of the signal and the associated frequency deviation and thereby insure high quality transmissions.

The exemplary digital processor for reduced distortion and frequency deviation initially receives a digital input signal. In many applications, the provided signal may initially be in an analog form. This analog signal could be a voice signal or any other audio signal.

Figure 6:
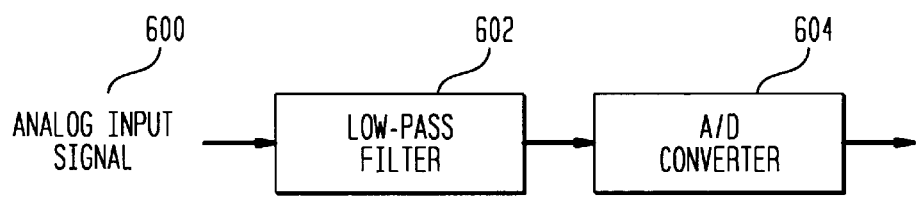
FIG. 6 is a block diagram of an exemplary digital input source which provides an input for an analog signal.

In FIG. 6, the digital input signal source is depicted to include an analog input signal. In this embodiment of the invention, the analog input signal 600 is received by a first low-pass filter 602. The first low-pass filter eliminates the higher frequencies in the analog signal which can introduce harmful aliasing during the analog-to-digital conversion. The output of the first low-pass filter is received by the A/D converter 604. The A/D converter samples the signal at an initial sampling frequency. To further avoid aliasing during the A/D conversion, the initial sampling frequency is at least twice the highest frequency of the signal. This is known as the Nyquist rate and represents a lower bound on the initial sampling frequency of the signal.

The exemplary digital processor digitally solves the problem of reducing distortion and frequency deviation. As such, it has many potential applications where size, cost, and power are driving design issues. One envisioned use is in the field of portable communications. Previously, limiting voice signals to reduce frequency deviation was done in the analog domain due to the distortion introduced with digital limiting. As such, analog mobile phone system designs were penalized by requiring analog processing of the signal. With the present invention, all signal processing of the analog voice signal can be accomplished digitally without reduction in the quality of the final transmitted signal. Thus, all processing can be incorporated onto a single chip design with resulting benefits in terms of size, cost, and power in addition to repeatability of the processing. Benefits of the present invention are not just limited to communications. Indeed, any application where harmonic distortion needs to be reduced can benefit from the present invention.

It will be understood that the embodiment of the present invention specifically shown and described is merely exemplary and that a person skilled in the art can make alternate embodiments using different configurations and functionally equivalent components. All such alternate embodiments are intended to be included in the scope of this invention as set forth in the following claims.

What is claimed:

1. A device for processing a digital signal received from a digital signal source, said device comprising:
   an up-sampling means to increase an initial sampling frequency of the digital signal by a given ratio to generate an up-sampled unfiltered digital signal;
   a non-linear operating means to process said up-sampled unfiltered digital signal to form a processed up-sampled unfiltered digital signal;
   a low pass filter accepting said processed up-sampled unfiltered digital signal; and
   a converting means to decrease an output of said low pass filter to said initial sampling frequency.

2. The device according to claim 1, wherein said given ratio is a number greater than one.

3. The device according to claim 2, wherein said non-linear operating means is a soft limiter, said soft limiter bypassing said up-sampled unfiltered digital signal having a magnitude less than a given value, and said soft limiter limiting said up-sampled unfiltered digital signal having a magnitude greater than said given value to a value equal to said given value.

4. The device according to claim 3, wherein said soft limiter implements an operation represented by
   $y(t)=x(t)$, when $|x(t)|<T$
   $y(t)=T$, when $x(t)>T$
   $y(t)=-T$, when $x(t)<T$
   wherein $x(t)$ is a signal prior to soft limiting, $y(t)$ is said soft limited signal and T is a predetermined magnitude of said soft limited signal.

5. The device according to claim 1, wherein said non-linear operating means is a dynamic range of the device.

6. The device according to claim 1, further including:
   a digital-to-analog converter receiving an output of said converting means; and
   a FM modulator receiving an output of said digital-to-analog converter.

7. The device according to claim 6, wherein an analog audio signal feeds the digital signal source, the source comprising:
   a first low-pass filter receiving said analog audio signal; and
   an analog-to-digital converter receiving an output of said first low-pass filter to generate said digital signal with said initial sampling frequency.

8. An integrated circuit for processing a digital signal for reduced distortion and frequency deviation, said digital signal being received from a digital signal source, said circuit comprising:
   an up-sampling means to increase an initial sampling frequency of the digital signal by a given ratio to generate an up-sampled unfiltered digital signal;
   a non-linear operating means to process the up-sampled unfiltered digital signal to form a processed up-sampled unfiltered digital signal;
   a low pass filter accepting the processed up-sampled unfiltered digital signal; and
   a converting means to decrease an output of the low pass filter to the initial sampling frequency.

9. The circuit according to claim 8, wherein the given ratio is a number greater than one.

10. The circuit according to claim 9, wherein the non-linear operating means is a soft limiter, the soft limiter bypassing the up-sampled unfiltered digital signal having a magnitude less than a given value, and the soft limiter limiting the up-sampled unfiltered digital signal having a magnitude greater than the given value to a value equal to the given value.

11. The device according to claim 10, wherein said soft limiter implements an operation represented by
    $y(t)=x(t)$, when $|x(t)|<T$
    $y(t)=T$, when $x(t)>T$
    $y(t)=-T$, when $x(t)<-T$
    wherein $x(t)$ is a signal prior to soft limiting, $y(t)$ is said soft limited signal and T is a predetermined magnitude of said soft limited signal.

12. The circuit according to claim 9, wherein the non-linear operating means is a dynamic range of the circuit.

13. The circuit according to claim 9, further including:
    a digital-to-analog converter receiving an output of the converting means; and
    a FM modulator receiving an output of the digital-to-analog converter.

14. The circuit according to claim 13, wherein an analog signal feeds the source, the source comprising:
    a first low-pass filter receiving the analog signal; and
    an analog-to-digital converter receiving an output of the first low-pass filter to generate the digital signal, the digital signal having said initial sampling frequency.

15. A communications system having a digital signal source, the system processing a digital signal from the digital signal source for reduced distortion and frequency deviation, the system comprising:
    an up-sampling converter coupled to an output of the digital signal source, said up-sampling converter increasing an initial sampling frequency of the digital signal;
    a non-linear processor coupled to an output of the up-sampling converter, said non-linear processor operating on an unfiltered output signal from said up-sampling converter;
    a low-pass filter coupled to an output of the non-linear processor, said low pass filter operating on an output signal of said non-linear processor; and
    a down-sampling converter coupled to an output of the low-pass filter, said down-sampling converter reducing an output of said low-pass filter to said initial sampling frequency.

16. The system according to claim 15, further including:
    a digital-to-analog converter coupled to an output of the down-sampling converter; and
    a FM modulator coupled to the output of the digital-to-analog converter.

17. The system according to claim 16, wherein an analog audio signal source feeds the digital signal source, the digital signal source comprising:
    a first low pass filter coupled to the analog audio signal source; and
    an analog-to-digital converter coupled to an output of the first low-pass filter.

18. The system according to claim 15, wherein said up-sampling converter increases said initial sampling frequency of the digital signal by a given ratio.

19. The system according to claim 18, wherein said given ratio is a number greater than one.

20. The system according to claim 18, wherein the non-linear operating means is a soft limiter.

21. The system according to claim 20, wherein said soft limiter implements an operation represented by y(t)=x(t), when |x(t)|<T y(t)=T, when x(t)>T y(t)=−T, when x(t)<−T wherein x(t) is a signal prior to soft limiting, y(t) is said soft limited signal and T is a predetermined magnitude of said soft limited signal.

22. A method for processing a digital signal for reduced distortion and frequency deviation, comprising the steps of:

increasing an initial sampling frequency of the digital signal by a given ratio to generate an up-sampled unfiltered digital signal;

performing a non-linear operation on the up-sampled unfiltered digital signal to form a processed up-sampled unfiltered digital signal;

low pass filtering the processed up-sampled unfiltered digital signal to generate a filtered processed up-sampled digital signal; and decreasing the filtered processed up-sampled digital signal to the initial sampling frequency to generate a processed digital signal.

23. The method according to claim 22, wherein the given ratio is a number greater than one.

24. The method according to claim 23, wherein the non-linear operation step is a limiting step that bypasses the up-sampled unfiltered digital signal having a magnitude less than the given value while limiting the up-sampled unfiltered digital signal having a magnitude greater than the given value to a value equal to the given value.

25. The method according to claim 22, further including the steps of:

generating an analog audio signal;

performing a first low pass filtering of the analog audio signal to generate a filtered analog audio signal; and converting the filtered analog audio signal to the digital signal having the initial sampling frequency.

26. The method according to claim 25, further including the steps of:

converting the processed digital signal to generate a processed analog signal; and FM modulating the processed analog signal.

* * * * *